(12) United States Patent
Park et al.

(10) Patent No.: US 8,163,835 B2
(45) Date of Patent: Apr. 24, 2012

(54) ANISOTROPIC CONDUCTIVE ADHESIVE COMPOSITION, ANISOTROPIC CONDUCTIVE FILM COMPRISING THE SAME, AND ASSOCIATED METHODS

(75) Inventors: Kyoung Soo Park, Uiwang-si (KR); Hyun Hee Namkung, Seoul (KR); Kyoung Hun Shin, Uiwang-si (KR); Byeong Hwan Jeon, Seoul (KR); Kang Bae Yoon, Seoul (KR); Cheon Seok Lee, Seongnam-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 273 days.

(21) Appl. No.: 12/232,552

(22) Filed: Sep. 19, 2008

(65) Prior Publication Data

US 2009/0078747 A1    Mar. 26, 2009

(30) Foreign Application Priority Data

Sep. 20, 2007   (KR) .................. 10-2007-0096041

(51) Int. Cl.
*C08L 33/04*   (2006.01)
*C08L 63/00*   (2006.01)
*C09J 163/00*  (2006.01)

(52) U.S. Cl. .................. 524/556; 524/434; 439/91

(58) Field of Classification Search .................. 524/556, 524/434; 434/91
See application file for complete search history.

(56) References Cited

U.S. PATENT DOCUMENTS

| | | | | |
|---|---|---|---|---|
| 4,695,508 A | * | 9/1987 | Kageyama et al. | 442/149 |
| 6,592,783 B2 | * | 7/2003 | Kumakura et al. | 252/500 |
| 6,777,464 B1 | * | 8/2004 | Watanabe et al. | 523/457 |

FOREIGN PATENT DOCUMENTS

JP     3 587 859 B2   11/2004

OTHER PUBLICATIONS http://www.lookchem.com/cas-402/40220-08-4.html, 2008.*

* cited by examiner

*Primary Examiner* — Satya Sastri
(74) *Attorney, Agent, or Firm* — Lee & Morse, P.C.

(57) ABSTRACT

An anisotropic conductive adhesive composition includes an acrylic rubber binder having a weight average molecular weight of about 100,000 to about 1,000,000, a first component including at least one of a mono(meth)acrylate compound and a di(meth)acrylate compound, a second component including at least one of a tri(meth)acrylate compound and a compound having more than three (meth)acrylate groups, an organic peroxisde, and conductive particles. The second component is present in an amount of about 1 to about 10% by weight, based on the total weight of the acrylic rubber, the first component, the second component, the organic peroxide, and the conductive particles.

13 Claims, 4 Drawing Sheets

FORMULA 1:

$$-[CH_2-CH]-$$
$$\phantom{-[CH_2-}|$$
$$\phantom{-[CH_2-}COOR$$

FORMULA 2:

$$CH_2=C(CH_3)-COOCH_3$$

FORMULA 3:

$$CH_2=CH-CN$$

FORMULA 4:

$$CH_2=CH-C_6H_5$$

FORMULA 5:

$$R\text{+}O-\overset{O}{\overset{\|}{C}}-\overset{H}{\underset{|}{C}}=CH_2\text{]}_n$$

FORMULA 6:

$$R\text{+}O-\overset{O}{\overset{\|}{C}}-\overset{CH_3}{\underset{|}{C}}=CH_2\text{]}_n$$

FORMULA 7:

$$CH_2=CH-\overset{O}{\overset{\|}{C}}-O-CH_2-\overset{OH}{\underset{|}{C}H}-CH_2-O-\overset{CH_3}{\underset{|}{C}H}-CH_2-O-C_6H_4-\overset{CH_3}{\underset{\underset{CH_3}{|}}{C}}-C_6H_4-O-CH_2-\overset{CH_3}{\underset{|}{C}H}-O-CH_2-\overset{OH}{\underset{|}{C}H}-CH_2-O-\overset{O}{\overset{\|}{C}}-CH=CH_2$$

FIG. 1
FORMULA 1: 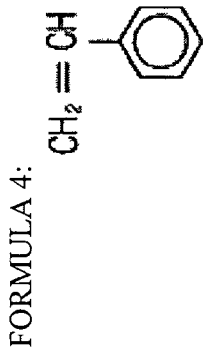
FORMULA 2:
$$CH_2=C\underset{COOCH_3}{\overset{CH_3}{|}}$$
FORMULA 3:
$$CH_2=CH\underset{CN}{|}$$
FORMULA 4:
$$CH_2=CH-C_6H_5$$
FORMULA 5:
$$Rf[O-\underset{\underset{H}{|}}{\overset{O}{\overset{||}{C}}}-C=CH_2]_n$$
FORMULA 6:
$$Rf[O-\underset{\underset{CH_3}{|}}{\overset{O}{\overset{||}{C}}}-C=CH_2]_n$$
FORMULA 7: 

FIG. 2

TABLE 1

| | Example 1 | Example 2 | Example 3 | Example 4 | Comp. Example 1 | Comp. Example 2 |
|---|---|---|---|---|---|---|
| A (wt%) | 55.5 (1) | 45.7 (1) | 30.0 (1) | 8.6 (1) | 57.1 (1) | 34.5 (1) |
| B (wt%) | 38.1 (2) | 47.2 (2) | 61.8 (2) | 47.1 (2) | 38.0 (6) | 46.0 (6) |
| C (wt%) | 1.5 (3) | 1.8 (3) | 2.4 (3) | 1.7 (3) | 0 | 13.8 (3) |
| D (wt%) | 1.6 (4) | 2.0 (4) | 2.5 (4) | 2.0 (4) | 1.5 (4) | 2.4 (7) |
| E (wt%) | 3.3 (5) | 3.3 (5) | 3.3 (5) | 6.4 (5) | 3.4 (5) | 3.3 (5) |
| Thermoplastic resins (wt%) | | | | 34.2 | | |

Notes:
A: Acrylic rubber binder (weight average molecular weight = 100,000~1,000,000)
B: A first component including at least one of a mono(meth)acrylate compound and a di(meth)acrylate compound
C: A second component including at least one of a tri(meth)acrylate compound and a compound having more than three (meth)acrylate groups
D: Organic peroxide(s)
E: Conductive particles (1) SG80H
(2) VR60/Formula 7/2-methacryloyloxyethyl acid phosphate
(3) Pentaerythritol triacrylate
(4) Lauroyl peroxide/benzoyl peroxide
(5) Nickel particles (T110)
(6) VR60/Formula 7
(7) Benzoyl peroxide

FIG. 3

TABLE 2

| Processing conditions | Example No. | Adhesive Strength (gf/cm) | Connection resistance (Ω) | |
|---|---|---|---|---|
| | | | Initial | After 250 hr |
| 150°C, 4 sec., 3 MPa | Example 1 | 544 | 0.26 | 0.35 |
| | Example 2 | 410 | 0.26 | 0.29 |
| | Example 3 | 304 | 0.25 | 0.27 |
| | Example 4 | 868 | 0.34 | 0.43 |
| | Comp. Example 1 | 293 | 0.31 | 4.39 |
| | Comp. Example 2 | 105 | 0.26 | 0.29 |
| | Comp. Example 3 | 222 | 0.39 | 1.17 |
| | Comp. Example 4 | 585 | 1.30 | 1.75 |
| 190°C, 4 sec., 3 MPa | Example 1 | 920 | 0.27 | 0.29 |
| | Example 2 | 700 | 0.26 | 0.27 |
| | Example 3 | 338 | 0.26 | 0.27 |
| | Example 4 | 744 | 0.31 | 0.32 |
| | Comp. Example 1 | 622 | 1.80 | 10.5 |
| | Comp. Example 2 | 199 | 0.27 | 0.28 |
| | Comp. Example 3 | 566 | 0.41 | 1.23 |
| | Comp. Example 4 | 951 | 1.32 | 1.39 |

FIG. 4
PROVIDE FIRST CIRCUIT HAVING A FIRST TERMINAL AND SECOND CIRCUIT HAVING A SECOND TERMINAL
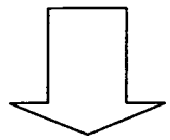
INTERPOSE ANISOTROPIC CONDUCTIVE FILM BETWEEN FIRST AND SECOND TERMINALS
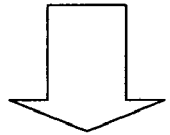
FORM ELECTRICAL CONNECTION BETWEEN THE FIRST AND SECOND TERMINALS

US 8,163,835 B2

ANISOTROPIC CONDUCTIVE ADHESIVE COMPOSITION, ANISOTROPIC CONDUCTIVE FILM COMPRISING THE SAME, AND ASSOCIATED METHODS

BACKGROUND OF THE INVENTION

1. Field of the Invention

Embodiments relate to an anisotropic conductive adhesive composition, an anisotropic conductive film comprising the same, and associated methods.

2. Description of the Related Art

An anisotropic conductive film (ACF) generally refers to a film in which conductive particles such as metal particles, e.g., nickel (Ni), copper (Cu), or gold (Au) particles, or metal-coated polymer particles are dispersed in an electrically insulating adhesive resin. Generally, the anisotropic conductive film may be interposed between circuits, followed by heating/pressing under specific conditions to electrically connect circuit terminals of the circuits. The electrically insulating adhesive resin fills a space between the adjacent circuit terminals and electrically isolates the conductive particles from one another.

SUMMARY OF THE INVENTION

Embodiments are therefore directed to an anisotropic conductive adhesive composition, an anisotropic conductive film comprising the same, and associated methods, which substantially overcome one or more of the problems due to the limitations and disadvantages of the related art.

It is therefore a feature of an embodiment to provide an anisotropic conductive adhesive film composition that provides good electrical conductivity and includes poly(meth)acrylates which form a stable adhesive film.

It is therefore another feature of an embodiment to provide an anisotropic conductive film that enables the use of short processing times while providing reliable connections between circuit terminals.

At least one of the above and other features and advantages may be realized by providing an anisotropic conductive adhesive composition including an acrylic rubber binder having a weight average molecular weight of about 100,000 to about 1,000,000, a first component including at least one of a mono (meth)acrylate compound and a di(meth)acrylate compound, a second component including at least one of a tri(meth)acrylate compound and a compound having more than three (meth)acrylate groups, an organic peroxide, and conductive particles. The second component may be present in an amount of about 1 to about 10% by weight, based on the total weight of the acrylic rubber, the first component, the second component, the organic peroxide, and the conductive particles.

The composition may include about 5 to about 60% by weight of the acrylic rubber, about 30 to about 70% by weight of the first component, about 1 to about 10% by weight of the organic peroxide, and about 1 to about 10% by weight of the conductive particles.

The acrylic rubber may be a copolymer of an acrylic ester and at least one of methyl methacrylate, acrylonitrile, and styrene. The acrylic rubber may include at least one of a hydroxyl, a carboxyl, and an epoxy functional group. The first component may include at least one of epoxy acrylate, urethane acrylate, polyester acrylate, and phosphate acrylate. The at least one of a tri(meth)acrylate compound and a compound having more than three (meth)acrylate groups in the second component may have a (meth)acrylate equivalent weight of about 500 or less. A reaction initiation temperature of the organic peroxide may be about 70 to about 150° C., as measured by differential scanning calorimetry (DSC).

The composition may further include at least one of a modified thermoplastic resin having (meth)acrylate groups and a thermoplastic resin. The at least one of a thermoplastic resin and a modified thermoplastic resin may be present in an amount of about 40% by weight or less, based on the total weight of solid components in the composition.

The first component may include at least one of methyl methacrylate, ethyl methacrylate, n-butyl methacrylate, isobutyl methacrylate, t-butyl methacrylate, 2-ethyl hexyl methacrylate, isodecyl methacrylate, n-lauryl methacrylate, C12-C15 alkyl methacrylates, n-stearyl methacrylate, n-butoxyethyl methacrylate, butoxydiethylene glycol methacrylate, methoxytriethylene glycol methacrylate, methoxypolyethylene glycol methacrylate, cyclohexyl methacrylate, tetrahydrofurfuryl methacrylate, benzyl methacrylate, 2-phenoxyethyl methacrylate, isobornyl methacrylate, 2-hydroxyethyl methacrylate, 2-hydroxypropyl methacrylate, 2-hydroxyethyl acrylate, 2-hydroxybutyl acrylate, 2-hydroxybutyl methacrylate, dimethylaminoethyl methacrylate, diethylaminoethyl methacrylate, methacrylic acid, 2-methacryloyloxyethyl succinic acid, 2-methacryloyloxyethyl hexahydrophthalate, 2-methacryloyloxyethyl 2-hydroxypropyl phthalate, glycidyl methacrylate, 2-methacryloyloxyethyl acid phosphate, ethylene glycol dimethacrylate, diethylene glycol dimethacrylate, triethylene glycol dimethacrylate, 1,4-butanediol dimethacrylate, neopentyl glycol dimethacrylate, 1,6-hexanediol dimethacrylate, 1,9-nonanediol dimethacrylate, 1,10-decanediol dimethacrylate, glycerin dimethacrylate, 2-hydroxy-3-acryloyloxypropyl methacrylate, dimethylol tricyclodecane dimethacrylate, dimethacrylate of ethylene oxide modified bisphenol A, trifluoroethyl methacrylate, perfluorooctylethyl methacrylate, isoamyl acrylate, lauryl acrylate, isotetradecyl acrylate, stearyl acrylate, butoxyethyl acrylate, ethoxydiethylene glycol acrylate, methoxytriethylene glycol acrylate, 2-ethyl hexylene glycol acrylate, methoxypolyethylene glycol acrylate, methoxydipropylene glycol acrylate, phenoxyethyl acrylate, phenoxypolyethylene glycol acrylate, acrylate of ethylene oxide modified nonylphenol, tetrahydrofurfuryl acrylate, isobornyl acrylate, 2-hydroxypropyl acrylate, 2-hydroxy-3-phenoxypropyl acrylate, 2-acryloyloxyethyl succinate, 2-acryloyloxyethyl hexahydrophthalate, 2-acryloyloxyethyl phthalate, 2-acryloyloxyethyl-2-hydroxyethyl phthalate, neopentyl glycol-benzoate-acrylate, 2-acryloyloxyethyl phosphate, triethylene glycol diacrylate, polytetramethylene glycol diacrylate, neopentyl glycol diacrylate, 3-methyl-1,5-pentanediol diacrylate, 1,6-hexanediol diacrylate, 2-butyl-2-ethyl-1,3-propanediol diacrylate, 1,9-nonanediol diacrylate, 2-methyl-1,8-octanediol-diacrylate, dimethylol tricyclodecane diacrylate, diacrylate of ethylene oxide modified bisphenol A, diacrylate of propylene oxide modified bisphenol A, trimethylolpropane-benzoate-acrylate, dimethacrylate of bisphenol A diglycidyl ether, diacrylate of bisphenol A diglycidyl ether, reaction products of 2-hydroxy-3-phenoxy propyl acrylate and toluene diisocyanate, and ethylene oxide-modified isocyanurate diacrylate.

The second component may include at least one of trimethylolpropane trimethacrylate, trimethylolpropane triacrylate, triacrylate of ethylene oxide modified trimethylolpropane, pentaerythritol triacrylate, pentaerythritol tetraacrylate, dipentaerythritol hexaacrylate, reaction products of pentaerythritol triacrylate and hexamethylene diisocyanate, reaction products of pentaerythritol triacrylate and toluene diisocyanate, reaction products of pentaerythritol triacrylate and isophorone diisocyanate, reaction products of dipentaerythritol pentaacrylate and hexamethylene diisocyanate, and ethylene oxide-modified isocyanurate triacrylate.

At least one of the above and other features and advantages may also be realized by providing an anisotropic conductive film including an acrylic rubber binder having a weight average molecular weight of about 100,000 to about 1,000,000, a first component including at least one of a mono(meth)acrylate compound and a di(meth)acrylate compound, a second component including at least one of a tri(meth)acrylate compound and a compound having more than three (meth)acrylate groups, an organic peroxide, and conductive particles. The second component may be present in an amount of about 1 to about 10% by weight, based on the total weight of the acrylic rubber, the first component, the second component, the organic peroxide, and the conductive particles.

At least one of the above and other features and advantages may also be realized by providing a method of forming an anisotropic conductive film, the method including providing an anisotropic conductive adhesive film composition, and forming the composition into a film shape. The composition may include an acrylic rubber binder having a weight average molecular weight of about 100,000 to about 1,000,000, a first component including at least one of a mono(meth)acrylate compound and a di(meth)acrylate compound, a second component including at least one of a tri(meth)acrylate compound and a compound having more than three (meth)acrylate groups, an organic peroxide, and conductive particles. The second component may be present in an amount of about 1 to about 10% by weight, based on the total weight of the acrylic rubber, the first component, the second component, the organic peroxide, and the conductive particles.

At least one of the above and other features and advantages may also be realized by providing a method of forming an electrical connection between terminals, the method including providing a first circuit having a first terminal and a second circuit having a second terminal, interposing an anisotropic conductive film between the first and second terminals, and forming an electrical connection between the first and second terminals. The anisotropic conductive film may include an acrylic rubber binder having a weight average molecular weight of about 100,000 to about 1,000,000, a first component including at least one of a mono(meth)acrylate compound and a di(meth)acrylate compound, a second component including at least one of a tri(meth)acrylate compound and a compound having more than three (meth)acrylate groups, an organic peroxide, and conductive particles. The second component may be present in an amount of about 1 to about 10% by weight, based on the total weight of the acrylic rubber, the first component, the second component, the organic peroxide, and the conductive particle.

The anisotropic conductive film may be heated and pressed for less than 10 seconds to connect the first and second terminals.

BRIEF DESCRIPTION OF THE DRAWINGS

The above and other features and advantages will become more apparent to those of ordinary skill in the art by describing in detail exemplary embodiments with reference to the attached drawings, in which:

FIG. 1 illustrates Formulae 1 through 7;
FIG. 2 illustrates Table 1 listing components used in Examples 1 through 4 and Comparative Examples 1 and 2;
FIG. 3 illustrates Table 2 listing adhesive strength and resistance properties for samples prepared in Examples 1 through 4 and Comparative Examples 1 through 4; and FIG. 4 illustrates a flow chart of operations in a method of forming an electrical connection according to an embodiment.

DETAILED DESCRIPTION OF THE INVENTION

Korean Patent Application No. 10-2007-0096041, filed on Sep. 20, 2007, in the Korean Intellectual Property Office, and entitled: "Highly Reliable Anisotropic Conductive Adhesive Composition Comprising Acrylic Rubber and Anisotropic Conductive Film Comprising the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

As used herein, the terms "a" and "an" are open terms that may be used in conjunction with singular items or with plural items. For example, the term "an organic peroxide" may represent a single compound, e.g., acetylacetone peroxide, or multiple compounds in combination, e.g., acetylacetone peroxide mixed with methylcyclohexanone peroxide.

As used herein, molecular weights of polymeric materials are weight average molecular weights, unless otherwise indicated.

As used herein, the terms "weight percent" and "parts by weight" indicate values that are exclusive of solvent, unless otherwise indicated. For example, where a composition is composed of two components A and B, with A present in 35 parts by weight and B present in 65 parts by weight, based on the total amount of the composition, the addition of 10 parts by weight of solvent to the composition would result in the composition continuing to have 35 parts by weight A and 65 parts by weight B, based on the total amount of the composition.

An embodiment provides an anisotropic conductive adhesive composition including an acrylic rubber as a binder, a compound having one or two (meth)acrylate groups, a compound having three or more (meth)acrylate groups, an organic peroxide, and conductive particles.

The anisotropic conductive adhesive composition may include about 5 to about 60% by weight, based on the total solids content of the composition, of the acrylic rubber, which may have a weight average molecular weight of about 100,000 to about 1,000,000. The anisotropic conductive adhesive composition may also include about 30 to about 70% by weight of the compound having one or two (meth)acrylate groups, about 1 to about 10% by weight of the compound having three or more (meth)acrylate groups, about 1 to about 10% by weight of the organic peroxide, and about 1 to about 10% by weight of the conductive particles, weight percentages being based on the total solids content of the composition.

(A) Acrylic Rubber

The acrylic rubber may be a homopolymer having an acrylic ester as a repeating unit. In an embodiment, the acrylic rubber may be represented by Formula 1:

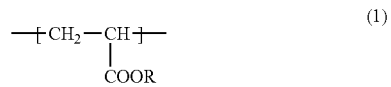
(1)

In Formula 1, R may be hydrogen or an alkyl group.

In another embodiment, the acrylic rubber may be a copolymer of acrylic esters having two or more different alkyl groups in the side chain.

In another embodiment, the acrylic rubber may further include, as repeating units, one or more monomers selected from methyl methacrylate, acrylonitrile, and styrene, which are represented by Formulas 2, 3, and 4, respectively:

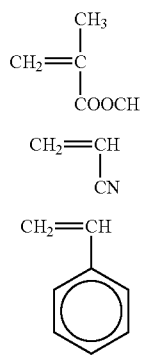

As the length of R in the side chain in Formula 1 increases in the order: hydrogen<methyl<ethyl<n-butyl, etc., the glass transition temperature ($T_g$) of the acrylic rubber may tend to decrease. Further, the thermal flowability (viscosity) may be increased, the connection reliability may be deteriorated, and the low-temperature resistance may be improved with increasing length of the side chain. Therefore, desired characteristics of the composition suitable for circuit connection may be attained by varying the length and structure of the side chain.

One or more monomers, e.g., methyl methacrylate, acrylonitrile, and/or styrene, may be introduced to attain additional characteristics while maintaining the inherent adhesive strength of the acrylic rubber and the miscibility of the acrylic rubber with the other components. Further, the acrylic rubber may have at least one functional group selected from hydroxyl, carboxyl, and epoxy groups.

The weight average molecular weight of the acrylic rubber is preferably about 100,000 to about 1,000,000. Maintaining the weight average molecular weight at about 100,000 or more may help ensure that a film produced using the acrylic rubber exhibits sufficient strength and good adhesion. Maintaining the weight average molecular weight at about 1,000,000 or less may help ensure that the acrylic rubber is readily miscible with other resins, enabling the preparation of a homogeneous solution and providing good connection reliability.

The acrylic rubber is preferably present in an amount of about 5 to about 60% by weight, more preferably about 8 to about 50% by weight, and most preferably about 10 to about 45% by weight, based on the total solids content of the composition. Maintaining the amount of the acrylic rubber at about 5% by weight or more may help ensure that a film produced using the acrylic rubber exhibits good flexibility, pressure-sensitive adhesiveness, and adhesion. Maintaining the amount of the acrylic rubber at about 60% by weight or less may help ensure that the structural density of a final cured product is enhanced, providing low connection resistance even under high temperature (85° C.) and humidity (RH 85%) conditions.

(B) Compound having one or two (meth)acrylate groups ('compound (B)')

Compound (B) may be cured under heat and pressure during a circuit connection process to secure the electrical connection between circuit terminals. Compound (B) can be generally represented by Formula 5 (acrylate) or Formula 6 (methacrylate):

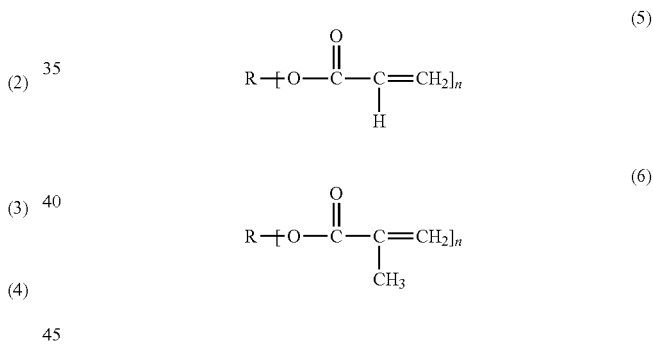

For compound (B), in Formulae 5 and 6, n is 1 or 2, where n=1 corresponds to a compound having one (meth)acrylate group and n=2 corresponds to a compound having two (meth)acrylate groups. It is noted that the structures illustrated in Formulae 5 and 6 do not illustrate polymers having a (meth)acrylate chain length corresponding to the value n. Rather, the central group R may have 1 or 2 (meth)acrylate substituent groups pendant therefrom, i.e., n represents the number of pendant reactive groups. The group R represents a group to which each of the pendant (meth)acrylate groups is bonded. R may be, e.g., an organic compound such a monomer, an oligomer, or a polymer. The one or two (meth)acrylate groups are configured to participate in the curing of compound (B).

Compound (B) may be a monomer such as epoxy acrylate, urethane acrylate, polyester acrylate, phosphate acrylate, etc.; an oligomer or polymer of such monomers; or a combination thereof. An inorganic acid ester, such as phosphate like 2-methacryloyloxyethyl acid phosphate, may also be used.

Examples of mono(meth)acrylate or di(meth)acrylate compounds which may be used for compound B, and which have one or two (meth)acrylate groups, respectively, include: methyl methacrylate, ethyl methacrylate, n-butyl methacrylate, isobutyl methacrylate, t-butyl methacrylate, 2-ethyl hexyl methacrylate, isodecyl methacrylate, n-lauryl methacrylate, C12-C15 alkyl methacrylates, n-stearyl methacrylate, n-butoxyethyl methacrylate, butoxydiethylene glycol methacrylate, methoxytriethylene glycol methacrylate, methoxypolyethylene glycol methacrylate, cyclohexyl methacrylate, tetrahydrofurfuryl methacrylate, benzyl methacrylate, 2-phenoxyethyl methacrylate, isobornyl methacrylate, 2-hydroxyethyl methacrylate, 2-hydroxypropyl methacrylate, 2-hydroxyethyl acrylate, 2-hydroxybutyl acrylate, 2-hydroxybutyl methacrylate, dimethylaminoethyl methacrylate, diethylaminoethyl methacrylate, methacrylic acid, 2-methacryloyloxyethyl succinic acid, 2-methacryloyloxyethyl hexahydrophthalate, 2-methacryloyloxyethyl 2-hydroxypropyl phthalate, glycidyl methacrylate, 2-methacryloyloxyethyl acid phosphate, ethylene glycol dimethacrylate, diethylene glycol dimethacrylate, triethylene glycol dimethacrylate, 1,4-butanediol dimethacrylate, neopentyl glycol dimethacrylate, 1,6-hexanediol dimethacrylate, 1,9-nonanediol dimethacrylate, 1,10-decanediol dimethacrylate, glycerin dimethacrylate, 2-hydroxy-3-acryloyloxypropyl methacrylate, dimethylol tricyclodecane dimethacrylate, dimethacrylate of ethylene oxide modified bisphenol A, trifluoroethyl methacrylate, perfluorooctylethyl methacrylate, isoamyl acrylate, lauryl acrylate, isotetradecyl acrylate, stearyl acrylate, butoxyethyl acrylate, ethoxydiethylene glycol acrylate, methoxytriethylene glycol acrylate, 2-ethyl hexylene glycol acrylate, methoxypolyethylene glycol acrylate, methoxydipropylene glycol acrylate, phenoxyethyl acrylate, phenoxypolyethylene glycol acrylate, acrylate of ethylene oxide modified nonylphenol, tetrahydrofurfuryl acrylate, isobornyl acrylate, 2-hydroxypropyl acrylate, 2-hydroxy-3-phenoxypropyl acrylate, 2-acryloyloxyethyl succinate, 2-acryloyloxyethyl hexahydrophthalate, 2-acryloyloxyethyl phthalate, 2-acryloyloxyethyl-2-hydroxyethyl phthalate, neopentyl glycol- benzoate-acrylate, 2-acryloyloxyethyl phosphate, triethylene glycol diacrylate, polytetramethylene glycol diacrylate, neopentyl glycol diacrylate, 3-methyl-1,5-pentanediol diacrylate, 1,6-hexanediol diacrylate, 2-butyl-2-ethyl-1,3-propanediol diacrylate, 1,9-nonanediol diacrylate, 2-methyl-1,8-octanediol-diacrylate, dimethylol tricyclodecane diacrylate, diacrylate of ethylene oxide modified bisphenol A, diacrylate of propylene oxide modified bisphenol A, trimethylolpropane-benzoate-acrylate, dimethacrylate of bisphenol A diglycidyl ether, diacrylate of bisphenol A diglycidyl ether, reaction products of 2-hydroxy-3-phenoxy propyl acrylate and toluene diisocyanate, and ethylene oxide-modified isocyanurate diacrylate. As the compound (B), compounds having one or two (meth)acrylate groups such as those listed above may be used alone, or as a mixture of two or more thereof.

Compound (B) is preferably present in an amount of about 30 to about 70% by weight, more preferably about 30 to about 60% by weight, and most preferably about 30 to about 50% by weight, based on the total solids content of the composition. Maintaining the amount of compound (B) at about 30% by weight or more may help ensure that the final cured product has a desirable acrylate structure as a whole. Maintaining the amount of compound (B) at about 70% by weight or less may help ensure that the final cured product is not too hard, as excessive hardness may result in interfacial peeling and/or poor adhesion.

(C) Compound having three or more (meth)acrylate groups ('compound (C)')

Compound (C) can be generally represented by Formula 5 or 6:

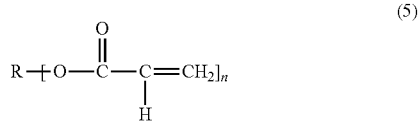

(5)

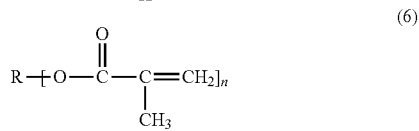

(6)

For compound C, n is 3 or greater, where n=3 corresponds to a compound having three (meth)acrylate groups and n=more than 3 corresponds to a compound having more than 3 (meth)acrylate groups. As noted above, the structures illustrated in Formulae 5 and 6 do not illustrate polymers having a (meth)acrylate chain length corresponding to the value n. Rather, the central group R may have 3 or more (meth)acrylate substituent groups pendant therefrom, i.e., n represents the number of pendant reactive groups. The group R represents a group to which each of the pendant (meth)acrylate groups is bonded. R may be, e.g., an organic compound such a monomer, an oligomer, or a polymer.

The presence of three or more (meth)acrylate groups capable of participating in the curing of compound (C) may increase the curing rate in a circuit connection process, enabling a short processing time, and may allow for the formation of a three-dimensional cured structure that provides high reliability.

The (meth)acrylate equivalent weight ("equivalent weight" =the weight average molecular weight of the compound (C)/the number of the functional groups) of compound (C) is preferably about 500 or less, more preferably about 450 or less, and most preferably about 400 or less. Maintaining the (meth)acrylate equivalent weight of compound (C) to be about 500 or less may help ensure that the curing rate and the density of the compound (C) is sufficiently high, such that a secure connection between circuit terminals may be formed and the connection reliability is enhanced.

For compound (C), examples of tri(meth)acrylate compounds and compounds having more than three (meth)acrylate groups include: trimethylolpropane trimethacrylate, trimethylolpropane triacrylate, triacrylate of ethylene oxide modified trimethylolpropane, pentaerythritol triacrylate, pentaerythritol tetraacrylate, dipentaerythritol hexaacrylate, reaction products of pentaerythritol triacrylate and hexamethylene diisocyanate, reaction products of pentaerythritol triacrylate and toluene diisocyanate, reaction products of pentaerythritol triacrylate and isophorone diisocyanate, reaction products of dipentaerythritol pentaacrylate and hexamethylene diisocyanate, and ethylene oxide-modified isocyanurate triacrylate.

Compound (C) is preferably present in an amount of about 1 to about 10% by weight, more preferably about 1 to about 7% by weight, and most preferably about 1 to about 4% by weight, based on the total solids content of the composition. Maintaining the amount of compound (C) at about 1% by weight or more may help ensure good reliability due to a high curing rate and the formation of a three-dimensional cured structure. Maintaining the amount of compound (C) at about 10% by weight or less may help avoid formation of a cured product that is too hard, and may help ensure that the uncured composition is not so highly reactive that storage stability is degraded.

(D) Organic Peroxide

The organic peroxide serves to induce curing of the compounds (B) and (C) under heat and pressure in a circuit connection process used to secure the connection between circuit terminals. To obtain a processing temperature of 200° C. or less and a pressing time of less than 10 seconds for circuit connection, the reaction initiation temperature of the organic peroxide is preferably about 70 to about 150° C., as measured by differential scanning calorimetry (DSC). The reaction initiation temperature of the organic peroxide is measured while heating about 1 mg of the sample at a rate of 10° C./min., and the starting point of the reaction is determined from the reaction peak by the tangential method.

Examples of suitable organic peroxides include: acetylacetone peroxide, methylcyclohexanone peroxide, methyl ethyl ketone peroxide, 1,1-bis(t-butylperoxy)cyclohexane, 1,1-bis (t-butylperoxy)-2-methylcyclohexane, 1,1-bis(t-butylperoxy)-3,3,5-trimethylcyclohexane, n-butyl-4,4-bis(t-butylperoxy)valerate, 1,1-bis(t-butylperoxy)-3,3,5-trimethylcyclohexane, 2,2-bis(t-butylperoxy)butane, t-butyl hydroperoxide, p-menthane hydroperoxide, 1,1,3,3-tetramethylbutyl hydroperoxide, a,a'-bis(t-butylperoxy)diisopropylbenzene, 2,5-dimethyl-2,5-bis(t-butylperoxy)hexane, 2,5-dimethyl-2,5-bis(t-butylperoxy)hexyne-3, benzoyl peroxide, lauroyl peroxide, stearoyl peroxide, succinic acid peroxide, 3,5,5-trimethylhexanoyl peroxide, di-2-ethoxyethyl peroxydicarbonate, diisopropyl peroxydicarbonate, di-3-methoxybutyl peroxydicarbonate, di-2-ethylhexyl peroxydicarbonate, bis(4-t-butylcyclohexyl)peroxydicarbonate, t-butyl peroxyacetate, t-butyl peroxy 2-ethylhexyl monocarbonate, t-butyl peroxy isopropyl monocarbonate, t-butyl peroxylaurate, t-butyl peroxymaleic acid, t-butyl peroxyneodecanoate, t-butyl peroxy 2-ethyl hexanoate, t-butyl peroxypivalate, t-butyl peroxybenzoate, t-butyl peroxy-m-toluate/benzoate mixture, t-butyl peroxy-3,5,5-trimethyl hexanoate, α,α'-bis (neodecanoylperoxy)diisopropyl benzene, cumyl peroxyneodecanoate, 1-cyclohexyl-1-methylethyl peroxyneodecanoate, 2,5-dimethyl-2,5-bis(m-toluoylperoxy)hexane, 2,5-dimethyl-2,5-bis(2-ethylhexanoylperoxy)hexane, 2,5-dimethyl-2,5-bis(benzoylperoxy)hexane, t-hexyl peroxy isopropyl monocarbonate, t-hexyl peroxyneodecanoate, t-hexyl peroxy-2-ethyl hexanoate, t-hexyl peroxypivalate, 1,1,3,3-tetramethylbutyl peroxyneodecanoate, 1,1,3,3-tetramethylbutyl peroxy 2-ethylhexanoate, and 3,3',4,4'-tetra(t-butyl peroxycarbonyl)benzophenone. Such organic peroxides may be used alone, or as a mixture of two or more thereof.

The organic peroxide is preferably present in an amount of about 1 to about 10% by weight, more preferably about 1 to about 7% by weight, and most preferably about 1 to about 4% by weight, based on the total solids content of the composition. Maintaining the amount of the organic peroxide at about 1% by weight or more may help ensure that the peroxide sufficiently increase the rate of the curing reaction, thus providing a short processing time. Maintaining the amount of the organic peroxide at about 10% by weight or less may help avoid an excessively high reactivity in the uncured composition, which may degrade storage stability of the composition.

(E) Conductive particles

The conductive particles provide electrical conductivity in the anisotropic conductive adhesive composition upon circuit connection. The conductive particles may include metal particles, such as Au, Ag, Ni, Cu, and/or Pb particles. The conductive particles may also include particles of carbon or a resin with a metal coated thereon. For example, the resin may be polyethylene, polypropylene, polyester, polystyrene, polyvinyl alcohol, and modified resins thereof; the metal may be Au, Ag, and/or Ni. The metal-coated conductive particles may be further coated with an insulating material. The size of the conductive particles may be determined depending on the pitch of circuits and may be, e.g., about 1 to about 30 µm, depending on the intended application.

The conductive particles are preferably present in an amount of about 1 to about 10% by weight, more preferably about 2 to about 9% by weight, and most preferably about 3 to about 8% by weight, based on the total solids content of the composition. Maintaining the amount of the conductive particles at about 1% by weight or more may help ensure a desired level of electrical conductivity. Maintaining the amount of the conductive particles at about 10% by weight or less may help avoid insulation failure.

The anisotropic conductive adhesive composition may further include a thermoplastic resin or a modified thermoplastic resin having acrylate groups to achieve improved adhesive strength while maintaining the basic physical properties of the composition. When included, the thermoplastic resin or the modified thermoplastic resin are preferably present in an amount of about 40% by weight or less, more preferably about 35% by weight or less, and most preferably about 30% by weight or less. Examples of such thermoplastic resins include: acrylonitrile butadiene copolymers, carboxyl-terminated acrylonitrile butadiene copolymers, polyvinyl butyral resins, and modified products thereof. Maintaining the thermoplastic resin at an amount of about 40% by weight or less may help ensure that the desirable characteristics of the acrylic rubber, e.g., flexibility, pressure-sensitive adhesiveness, and adhesion, are maintained, and may help maintain a high structural density in the cured structure.

The anisotropic conductive adhesive composition may further include one or more additives, e.g., polymerization inhibitors, antioxidants, heat stabilizers, etc. When included, such additives are preferably used in an amount of about 0.01 to about 10% by weight, more preferably about 0.01 to about 5% by weight, and most preferably about 0.01 to about 1% by weight.

Examples of suitable polymerization inhibitors include hydroquinone monomethyl ether, p-benzoquinone, phenothiazine, and mixtures thereof. Examples of suitable antioxidants include branched phenolic antioxidants and hydroxycinnamates. These antioxidants serve to prevent oxidation of the composition as a result of heat exposure, imparting heat stability to the composition. Specific examples of the antioxidants include [tetrakis-(methylene-(3,5-di-t-butyl-4-hydrocinnamate)methane, 3,5-bis(1,1-dimethylethyl)-4-hydroxybenzenepropanoic acid, thiol di-2,1-ethanediyl ester, octadecyl 3,5-di-t-butyl-4-hydroxyhydrocinnamate, all of which are commercially available from Ciba, and 2,6-di-t-butyl-p-methylphenol. These additives may be used alone or as a mixture of two or more thereof.

Another embodiment provides an anisotropic conductive film formed using the anisotropic conductive adhesive composition. A general apparatus or equipment may be used to produce the anisotropic conductive film using the anisotropic conductive adhesive composition. For example, the anisotropic conductive film may be produced by dissolving the anisotropic conductive adhesive composition in a suitable organic solvent, e.g., toluene, stirring the solution at a rate that does not to break the conductive particles, applying the solution to a thickness of about 10 to about 50 µm to a release film, and drying the resulting structure for a time sufficient to evaporate the solvent.

The following Examples and Comparative Examples are provided in order to set forth particular details of one or more embodiments. However, it will be understood that the embodiments are not limited to the particular details described.

EXAMPLES

The components shown in Table 1 in FIG. 2 were mixed to prepare respective compositions. Each of the compositions was applied to a release film and dried in an oven at 80° C. for 5 minutes to form an anisotropic conductive film. The films had a thickness of 35 μm and a width of 1.5 mm.

Example 1

55.5 wt % of an acrylic rubber (SG80H, Nagase Chemtex Corp. (Japan)), which was dissolved (solid content=20%) in methyl ethyl ketone, 18.5 wt % of a bisphenol A type epoxy acrylate resin (weight average molecular weight=7,500, VR60, Showa Highpolymer Co., LTD. (Japan)), which was dissolved (solid content=60%) in methyl ethyl ketone, 18.5 wt % of the bisphenol A type epoxy acrylate resin of Formula 7 (weight average molecular weight=2,500), 1.1 wt % of 2-methacryloyloxyethyl acid phosphate, 1.5 wt % of pentaerythritol triacrylate, 0.4 wt % of lauroyl peroxide, which was dissolved (solid content=10%) in toluene, 1.2 wt % of benzoyl peroxide, which was dissolved (solid content=10%) in toluene, and 3.3 wt % of nickel particles (T110, Inco) were mixed together to prepare an anisotropic conductive adhesive composition.

Formula 7:

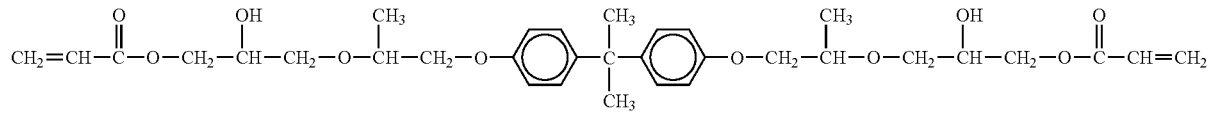

Example 2

45.7 wt % of acrylic rubber (SG80H, Nagase Chemtex Corp. (Japan)), which was dissolved (solid content=20%) in methyl ethyl ketone, 22.9 wt % of bisphenol A type epoxy acrylate resin (weight average molecular weight=7,500, VR60, Showa Highpolymer Co., LTD. (Japan)), which was dissolved (solid content=60%) in methyl ethyl ketone, 22.9 wt % of bisphenol A type epoxy acrylate resin of Formula 7 (weight average molecular weight=2,500), 1.4 wt % of 2-methacryloyloxyethyl acid phosphate, 1.8 wt % of pentaerythritol triacrylate, 0.5 wt % of lauroyl peroxide, which was dissolved (solid content=10%) in toluene, 1.5 wt % of benzoyl peroxide, which was dissolved (solid content=10%) in toluene, and 3.3 wt % of nickel particles (T110, Inco) were mixed together to prepare an anisotropic conductive adhesive composition.

Example 3

30.0 wt % of acrylic rubber (SG80H, Nagase Chemtex Corp. (Japan)), which was dissolved (solid content=20%) in methyl ethyl ketone, 30.0 wt % of bisphenol A type epoxy acrylate resin (weight average molecular weight=7,500, VR60, Showa Highpolymer Co., LTD. (Japan)), which was dissolved (solid content=60%) in methyl ethyl ketone, 30.0 wt % of bisphenol A type epoxy acrylate resin of Formula 7 (weight average molecular weight=2,500), 1.8 wt % of 2-methacryloyloxyethyl acid phosphate, 2.4 wt % of pentaerythritol triacrylate, 0.6 wt % of lauroyl peroxide, which was dissolved (solid content=10%) in toluene, 1.9 wt % of benzoyl peroxide, which was dissolved (solid content=10%) in toluene, and 3.3 wt % of nickel particles (T110, Inco) were mixed together to prepare an anisotropic conductive adhesive composition.

Example 4

8.6 wt % of acrylic rubber (SG80H, Nagase Chemtex Corp. (Japan)), which was dissolved (solid content=20%) in methyl ethyl ketone, 21.4 wt % of bisphenol A type epoxy acrylate resin (weight average molecular weight=7,500, VR60, Showa Highpolymer Co., LTD. (Japan)), which was dissolved (solid content=60%) in methyl ethyl ketone, 21.4 wt % of bisphenol A type epoxy acrylate resin of Formula 7 (weight average molecular weight=2,500), 4.3 wt % of 2-acryloyloxyethyl phosphate, 1.7 wt % of pentaerythritol triacrylate, 0.5 wt % of lauroyl peroxide, which was dissolved (solid content=10%) in toluene, 1.5 wt % of benzoyl peroxide, which was dissolved (solid content=10%) in toluene, 6.4 wt % of nickel particles (T110, Inco), 23.5 wt % of a carboxyl-terminated acrylonitrile butadiene copolymer (N34, Zeon (Japan)), which was dissolved (solid content=25%) in a mixed solvent of toluene/methyl ethyl ketone (2/1 (w/w)), and 10.7 wt % of a polyurethane acrylate (Chemicals), which was synthesized by polyaddition of a solution (50 vol %) of a polyol (content=60%, molecular weight ($M_w$)=20,000) in methyl ethyl ketone with hydroxyacrylate/isocyanate in a molar ratio of 1:1 in the presence of dibutyl tin dilaurylate as a catalyst under 1 atm at 90° C. for 5 hours, were mixed together to prepare an anisotropic conductive adhesive composition.

Comparative Example 1

57.1 wt % of acrylic rubber (SG80H, Nagase Chemtex Corp. (Japan)), which was dissolved (solid content=20%) in methyl ethyl ketone, 19.0 wt % of bisphenol A type epoxy acrylate resin (weight average molecular weight=7,500, VR60, Showa Highpolymer Co., LTD. (Japan)), which was dissolved (solid content=60%) in methyl ethyl ketone, 19.0 wt % of bisphenol A type epoxy acrylate resin of Formula 7 (weight average molecular weight=2,500), 0.4 wt % of lauroyl peroxide, which was dissolved (solid content=10%) in toluene, 1.1 wt % of benzoyl peroxide, which was dissolved (solid content=10%) in toluene, and 3.4 wt % of nickel particles (T110, Inco) were mixed together to prepare a composition.

Comparative Example 2

34.5 wt % of acrylic rubber (SG80H, Nagase Chemtex Corp. (Japan)), which was dissolved (solid content=20%) in methyl ethyl ketone, 11.5 wt % of bisphenol A type epoxy acrylate resin (weight average molecular weight=7,500, VR60, Showa Highpolymer Co., LTD. (Japan)), which was dissolved (solid content=60%) in methyl ethyl ketone, 34.5 wt % of bisphenol A type epoxy acrylate resin of Formula 7 (weight average molecular weight=2,500), 13.8 wt % of pentaerythritol triacrylate, 2.4 wt % of benzoyl peroxide, which was dissolved (solid content=10%) in toluene, and 3.3 wt % of nickel particles (T110, Inco) were mixed together to prepare a composition.

Comparative Example 3

30 wt % of a phenoxy resin (weight average molecular weight=58,000, PKFE, InChemRez) as a binder, 30 wt % of an epoxy resin (HP4032D, Dainippon Ink & Chemical (Japan)), 37 wt % of a latent curing agent (HXA3941HP, Asahi Chemical Industry (Japan)), and 3 wt % of nickel particles (T110, Inco) were mixed together to prepare a composition.

Comparative Example 4

30 wt % of a carboxyl-terminated acrylonitrile butadiene copolymer (N34, Zeon (Japan)), which was dissolved (solid content=25%) in a mixed solvent of toluene/methyl ethyl ketone (2/1 (w/w)), 30 wt % of an epoxy resin (HP4032D, Dainippon Ink & Chemical (Japan)), 37 wt % of a latent curing agent (HXA3941 HP, Asahi Chemical Industry (Japan)), and 3 wt % of nickel particles (T110, Inco) were mixed together to prepare a composition.

[Evaluation of Circuit Connection Performance and Reliability of the Anisotropic Conductive Films]

The circuit connection performance of films produced using the compositions of Examples 1-4 and Comparative Examples 1-4 were evaluated by the following procedure. First, a printed circuit board (PCB) having terminals (width=170 μm, interval=80 μm, height=36 μm) and a chip-on-film (COF) having terminals (width=125 μm, interval=125 μm, height=9 μm) were prepared. The pitch between the PCB and the COF was adjusted to 250 μm. Each of compositions of Examples 1-4 and Comparative Examples 1-4 was formed into a film, and the respective films were pressed on a circuit portion of the PCB under a pressure of 1 MPa at 70° C. for one second, and then the release film was removed. The COF was positioned such that the circuit terminals of the COF faced those of the PCB. The COF was thermally pressed on the PCB at a pressure of 3 MPa at 150° C. for 4 seconds, and also at a pressure of 3 MPa at 1 90° C. for 4 seconds.

The connection resistance and the 90° adhesive strength of the resulting circuit connection structures were measured to evaluate the circuit connection performance of the film prepared from Examples 1-4 and Comparative Examples 1-4. The circuit connection structures were aged in a chamber for 250 hours while maintaining the temperature and humidity of the chamber at 85° C. and 85%, respectively. The connection resistance of the aged circuit connection structures was measured to evaluate the connection reliability of the anisotropic conductive films. The results are shown in Table 2 in FIG. 3.

As can be seen from the results in Table 2, the circuit connection structures prepared using the films of Examples 1-4 had an adhesive strength greater than 300 gf/cm and an initial connection resistance lower than 0.5 Ω, even when the circuit connection process was performed at low temperature for a short time. These results indicate stable circuit connections. Further, the circuit connection structures using the films of Examples 1-4 had a connection resistance lower than 1.0 Ω even after aging under high temperature and humidity conditions (85° C., RH 85%) for 250 hours. More specifically, the connection resistance of the circuit connection structures was lower than 0.5 Ω, demonstrating that the films of Examples 1-4 were highly reliable for circuit connection.

In contrast, the circuit connection structure using the anisotropic conductive film of Comparative Example 1, which did not include a compound having three or more (meth)acrylate groups, showed unstable connection resistance after a short circuit connection process and particularly poor connection reliability. The circuit connection structure using the anisotropic conductive film of Comparative Example 2, which was produced using the compound having three or more (meth)acrylate groups in an amount exceeding 10 wt %, showed good results in connection resistance but had a very low adhesive strength.

The anisotropic conductive films of Comparative Examples 3 and 4, each of which was produced using a composition that included epoxy resin as a major component and a microcapsulated latent curing agent, did not show good results after a short circuit connection process at low temperature, possibly because the microcapsules need to be ruptured under heat and pressure to induce curing reactions. The circuit connection structure using the anisotropic conductive film of Comparative Example 3 showed insufficient adhesive strength and poor connection resistance after the circuit connection process at 3 MPa at 150° C. for 4 seconds. The circuit connection structure using the anisotropic conductive film of Comparative Example 3 showed sufficient adhesive strength after the circuit connection process at 3 MPa at 1 90° C. for 4 seconds, but the connection resistance was markedly increased. The circuit connection structure using the anisotropic conductive film of Comparative Example 4, which was produced using the thermoplastic resin, showed high adhesive strength, but had high resistance, possibly because a cured structure of the epoxy and the latent curing agent was incompletely formed and the thermoplastic resin impeded the formation of the cured structure.

As apparent from the foregoing, the use of the acrylic rubber as a binder, which exhibits excellent characteristics in terms of flexibility, pressure-sensitive adhesiveness, and adhesive strength, and the polyfunctional (meth)acrylate compounds as curable materials may provide an anisotropic conductive adhesive film that is highly reliable, even in a circuit connection process requiring a short processing time of less than 10 sec. The anisotropic conductive adhesive composition and film formed therefrom may be used for the connection of circuits and the mounting of elements in the fabrication of a variety of display devices, including liquid crystal devices (LCDs), and semiconductor devices.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An anisotropic conductive adhesive composition, comprising:
 about 5 to about 60% by weight of an acrylic rubber binder having a weight average molecular weight of about 100,000 to about 1,000,000;
 about 30 to about 70% by weight of a first component including at least one of a mono(meth)acrylate compound and a di(meth)acrylate compound;

about 1 to about 10% by weight of a second component including at least one of a tri(meth)acrylate compound and a compound having more than three (meth)acrylate groups;

about 1 to about 10% by weight of an organic peroxide; and about 1 to about 10% by weight of conductive particles, wherein:

all % by weight are based on a total weight of the acrylic rubber, the first component, the second component, the organic peroxide, and the conductive particles, and the first component includes at least one of methyl methacrylate, ethyl methacrylate, n-butyl methacrylate, isobutyl methacrylate, t-butyl methacrylate, 2-ethyl hexyl methacrylate, isodecyl methacrylate, n-lauryl methacrylate, C12-C15 alkyl methacrylates, n-stearyl methacrylate, n-butoxyethyl methacrylate, butoxydiethylene glycol methacrylate, methoxytriethylene glycol methacrylate, methoxypolyethylene glycol methacrylate, cyclohexyl methacrylate, tetrahydrofurfuryl methacrylate, benzyl methacrylate, 2-phenoxyethyl methacrylate, isobornyl methacrylate, 2-hydroxyethyl methacrylate, 2-hydroxypropyl methacrylate, 2-hydroxyethyl acrylate, 2-hydroxybutyl acrylate, 2-hydroxybutyl methacrylate, dimethylaminoethyl methacrylate, diethylaminoethyl methacrylate, methacrylic acid, 2-methacryloyloxyethyl succinic acid, 2-methacryloyloxyethyl hexahydrophthalate, 2-methacryloyloxyethyl 2-hydroxypropyl phthalate, glycidyl methacrylate, 2-methacryloyloxyethyl acid phosphate, ethylene glycol dimethacrylate, diethylene glycol dimethacrylate, triethylene glycol dimethacrylate, 1,4-butanediol dimethacrylate, neopentyl glycol dimethacrylate, 1,6-hexanediol dimethacrylate, 1,9-nonanediol dimethacrylate, 1,10-decanediol dimethacrylate, glycerin dimethacrylate, 2-hydroxy-3-acryloyloxypropyl methacrylate, dimethylol tricyclodecane dimethacrylate, dimethacrylate of ethylene oxide modified bisphenol A, trifluoroethyl methacrylate, perfluorooctylethyl methacrylate, isoamyl acrylate, lauryl acrylate, isotetradecyl acrylate, stearyl acrylate, butoxyethyl acrylate, ethoxydiethylene glycol acrylate, methoxytriethylene glycol acrylate, 2-ethyl hexylene glycol acrylate, methoxypolyethylene glycol acrylate, methoxydipropylene glycol acrylate, phenoxyethyl acrylate, phenoxypolyethylene glycol acrylate, acrylate of ethylene oxide modified nonylphenol, tetrahydrofurfuryl acrylate, isobornyl acrylate, 2-hydroxypropyl acrylate, 2-hydroxy-3-phenoxypropyl acrylate, 2-acryloyloxyethyl succinate, 2-acryloyloxyethyl hexahydrophthalate, 2-acryloyloxyethyl phthalate, 2-acryloyloxyethyl-2-hydroxyethyl phthalate, neopentyl glycol-benzoate-acrylate, 2-acryloyloxyethyl phosphate, triethylene glycol diacrylate, polytetramethylene glycol diacrylate, neopentyl glycol diacrylate, 3-methyl-1,5-pentanediol diacrylate, 1,6-hexanediol diacrylate, 2-butyl-2-ethyl-1,3-propanediol diacrylate, 1,9-nonanediol diacrylate, 2-methyl-1,8-octanediol-diacrylate, dimethylol tricyclodecane diacrylate, diacrylate of ethylene oxide modified bisphenol A, diacrylate of propylene oxide modified bisphenol A, trimethylolpropane-benzoate-acrylate, dimethacrylate of bisphenol A diglycidyl ether, diacrylate of bisphenol A diglycidyl ether, reaction products of 2-hydroxy-3-phenoxy propyl acrylate and toluene diisocyanate, and ethylene oxide-modified isocyanurate diacrylate.

2. The composition as claimed in claim 1, wherein the acrylic rubber is a copolymer of an acrylic ester and at least one of methyl methacrylate, acrylonitrile, and styrene.

3. The composition as claimed in claim 1, wherein the acrylic rubber includes at least one of a hydroxyl, a carboxyl, and an epoxy functional group.

4. The composition as claimed in claim 1, wherein the at least one of a tri(meth)acrylate compound and a compound having more than three (meth)acrylate groups in the second component has a (meth)acrylate equivalent weight of about 500 or less.

5. The composition as claimed in claim 1, further comprising at least one of a modified thermoplastic resin having (meth)acrylate groups and a thermoplastic resin.

6. The composition as claimed in claim 5, wherein the at least one of a thermoplastic resin and a modified thermoplastic resin is present in an amount of about 40% by weight or less, based on the total weight of solid components in the composition.

7. The composition as claimed in claim 1, wherein the second component includes at least one of trimethylolpropane trimethacrylate, trimethylolpropane triacrylate, triacrylate of ethylene oxide modified trimethylolpropane, pentaerythritol triacrylate, pentaerythritol tetraacrylate, dipentaerythritol hexaacrylate, reaction products of pentaerythritol triacrylate and hexamethylene diisocyanate, reaction products of pentaerythritol triacrylate and toluene diisocyanate, reaction products of pentaerythritol triacrylate and isophorone diisocyanate, reaction products of dipentaerythritol pentaacrylate and hexamethylene diisocyanate, and ethylene oxide-modified isocyanurate triacrylate.

8. An anisotropic conductive film, comprising:

about 5 to about 60% by weight of an acrylic rubber binder having a weight average molecular weight of about 100,000 to about 1,000,000;

about 30 to about 70% by weight of a first component including at least one of a mono(meth)acrylate compound and a di(meth)acrylate compound;

about 1 to about 10% by weight of a second component including at least one of a tri(meth)acrylate compound and a compound having more than three (meth)acrylate groups;

about 1 to about 10% by weight of an organic peroxide; and about 1 to about 10% by weight of conductive particles, wherein:

all % by weight are based on a total weight of the acrylic rubber, the first component, the second component, the organic peroxide, and the conductive particles, and the first component includes at least one of methyl methacrylate, ethyl methacrylate, n-butyl methacrylate, isobutyl methacrylate, t-butyl methacrylate, 2-ethyl hexyl methacrylate, isodecyl methacrylate, n-lauryl methacrylate, C12-C15 alkyl methacrylates, n-stearyl methacrylate, n-butoxyethyl methacrylate, butoxydiethylene glycol methacrylate, methoxytriethylene glycol methacrylate, methoxypolyethylene glycol methacrylate, cyclohexyl methacrylate, tetrahydrofurfuryl methacrylate, benzyl methacrylate, 2-phenoxyethyl methacrylate, isobornyl methacrylate, 2-hydroxyethyl methacrylate, 2-hydroxypropyl methacrylate, 2-hydroxyethyl acrylate, 2-hydroxybutyl acrylate, 2-hydroxybutyl methacrylate, dimethylaminoethyl methacrylate, diethylaminoethyl methacrylate, methacrylic acid, 2-methacryloyloxyethyl succinic acid, 2-methacryloyloxyethyl hexahydrophthalate, 2-methacryloyloxyethyl 2-hydroxypropyl phthalate, glycidyl methacrylate, 2-methacryloyloxyethyl acid phosphate, ethylene glycol dimethacrylate, diethylene glycol dimethacrylate, triethylene glycol dimethacrylate, 1,4-butanediol dimethacrylate, neopentyl glycol dimethacrylate, 1,6-hexanediol dimethacrylate, 1,9-nonanediol dimethacrylate, 1,10-decanediol dimethacrylate, glycerin dimethacrylate, 2-hydroxy-3-acryloyloxypropyl methacrylate, dimethylol tricyclodecane dimethacrylate, dimethacrylate of ethylene oxide modified bisphenol A, trifluoroethyl methacrylate, perfluorooctylethyl methacrylate, isoamyl acrylate, lauryl acrylate, isotetradecyl acrylate, stearyl acrylate, butoxyethyl acrylate, ethoxydiethylene glycol acrylate, methoxytriethylene glycol acrylate, 2-ethyl hexylene glycol acrylate, methoxypolyethylene glycol acrylate, methoxydipropylene glycol acrylate, phenoxyethyl acrylate, phenoxypolyethylene glycol acrylate, acrylate of ethylene oxide modified nonylphenol, tetrahydrofurfuryl acrylate, isobornyl acrylate, 2-hydroxypropyl acrylate, 2-hydroxy-3-phenoxypropyl acrylate, 2-acryloyloxyethyl succinate, 2-acryloyloxyethyl hexahydrophthalate, 2-acryloyloxyethyl phthalate, 2-acryloyloxyethyl-2-hydroxyethyl phthalate, neopentyl glycol-benzoate-acrylate, 2-acryloyloxyethyl phosphate, triethylene glycol diacrylate, polytetramethylene glycol diacrylate, neopentyl glycol diacrylate, 3-methyl-1,5-pentanediol diacrylate, 1,6-hexanediol diacrylate, 2-butyl-2-ethyl-1,3-propanediol diacrylate, 1,9-nonanediol diacrylate, 2-methyl-1,8-octanediol-diacrylate, dimethylol tricyclodecane diacrylate, diacrylate of ethylene oxide modified bisphenol A, diacrylate of propylene oxide modified bisphenol A, trimethylolpropane-benzoate-acrylate, dimethacrylate of bisphenol A diglycidyl ether, diacrylate of bisphenol A diglycidyl ether, reaction products of 2-hydroxy-3-phenoxy propyl acrylate and toluene diisocyanate, and ethylene oxide-modified isocyanurate diacrylate.

9. A method of forming an anisotropic conductive film, the method comprising:
   providing an anisotropic conductive adhesive film composition; and
   forming the composition into a film shape, wherein the composition includes:
   about 5 to about 60% by weight of an acrylic rubber binder having a weight average molecular weight of about 100,000 to about 1,000,000;
   about 30 to about 70% by weight of a first component including at least one of a mono(meth)acrylate compound and a di(meth)acrylate compound;
   about 1 to about 10% by weight of a second component including at least one of a tri(meth)acrylate compound and a compound having more than three (meth)acrylate groups;
   about 1 to about 10% by weight of an organic peroxide; and
   about 1 to about 10% by weight of conductive particles, all % by weight being based on a total weight of the acrylic rubber, the first component, the second component, the organic peroxide, and the conductive particles, and
   wherein the first component includes at least one of methyl methacrylate, ethyl methacrylate, n-butyl methacrylate, isobutyl methacrylate, t-butyl methacrylate, 2-ethyl hexyl methacrylate, isodecyl methacrylate, n-lauryl methacrylate, C12-C15 alkyl methacrylates, n-stearyl methacrylate, n-butoxyethyl methacrylate, butoxydiethylene glycol methacrylate, methoxytriethylene glycol methacrylate, methoxypolyethylene glycol methacrylate, cyclohexyl methacrylate, tetrahydrofurfuryl methacrylate, benzyl methacrylate, 2-phenoxyethyl methacrylate, isobornyl methacrylate, 2-hydroxyethyl methacrylate, 2-hydroxypropyl methacrylate, 2-hydroxyethyl acrylate, 2-hydroxybutyl acrylate, 2-hydroxybutyl methacrylate, dimethylaminoethyl methacrylate, diethylaminoethyl methacrylate, methacrylic acid, 2-methacryloyloxyethyl succinic acid, 2-methacryloyloxyethyl hexahydrophthalate, 2-methacryloyloxyethyl 2-hydroxypropyl phthalate, glycidyl methacrylate, 2-methacryloyloxyethyl acid phosphate, ethylene glycol dimethacrylate, diethylene glycol dimethacrylate, triethylene glycol dimethacrylate, 1,4-butanediol dimethacrylate, neopentyl glycol dimethacrylate, 1,6-hexanediol dimethacrylate, 1,9-nonanediol dimethacrylate, 1,10-decanediol dimethacrylate, glycerin dimethacrylate, 2-hydroxy-3-acryloyloxypropyl methacrylate, dimethylol tricyclodecane dimethacrylate, dimethacrylate of ethylene oxide modified bisphenol A, trifluoroethyl methacrylate, perfluorooctylethyl methacrylate, isoamyl acrylate, lauryl acrylate, isotetradecyl acrylate, stearyl acrylate, butoxyethyl acrylate, ethoxydiethylene glycol acrylate, methoxytriethylene glycol acrylate, 2-ethyl hexylene glycol acrylate, methoxypolyethylene glycol acrylate, methoxydipropylene glycol acrylate, phenoxyethyl acrylate, phenoxypolyethylene glycol acrylate, acrylate of ethylene oxide modified nonylphenol, tetrahydrofurfuryl acrylate, isobornyl acrylate, 2-hydroxypropyl acrylate, 2-hydroxy-3-phenoxypropyl acrylate, 2-acryloyloxyethyl succinate, 2-acryloyloxyethyl hexahydrophthalate, 2-acryloyloxyethyl phthalate, 2-acryloyloxyethyl-2-hydroxyethyl phthalate, neopentyl glycol- benzoate-acrylate, 2-acryloyloxyethyl phosphate, triethylene glycol diacrylate, polytetramethylene glycol diacrylate, neopentyl glycol diacrylate, 3-methyl-1,5-pentanediol diacrylate, 1,6-hexanediol diacrylate, 2-butyl-2-ethyl-1,3-propanediol diacrylate, 1,9-nonanediol diacrylate, 2-methyl-1,8-octanediol-diacrylate, dimethylol tricyclodecane diacrylate, diacrylate of ethylene oxide modified bisphenol A, diacrylate of propylene oxide modified bisphenol A, trimethylolpropane-benzoate-acrylate, dimethacrylate of bisphenol A diglycidyl ether, diacrylate of bisphenol A diglycidyl ether, reaction products of 2-hydroxy-3-phenoxy propyl acrylate and toluene diisocyanate, and ethylene oxide-modified isocyanurate diacrylate.

10. A method of forming an electrical connection between terminals, the method comprising:
    providing a first circuit having a first terminal and a second circuit having a second terminal;
    interposing an anisotropic conductive film between the first and second terminals: and
    forming an electrical connection between the first and second terminals, wherein the anisotropic conductive film includes:
    about 5 to about 60% by weight of an acrylic rubber binder having a weight average molecular weight of about 100,000 to about 1,000,000;
    about 30 to about 70% by weight of a first component including at least one of a mono(meth)acrylate compound and a di(meth)acrylate compound;
    about 1 to about 10% by weight of a second component including at least one of a tri(meth)acrylate compound and a compound having more than three (meth)acrylate groups;
    about 1 to about 10% by weight of an organic peroxide; and
    about 1 to about 10% by weight of conductive particles, all % by weight being based on a total weight of the acrylic rubber, the first component, the second component, the organic peroxide, and the conductive particles, and wherein the first component includes at least one of methyl methacrylate, ethyl methacrylate, n-butyl methacrylate, isobutyl methacrylate, t-butyl methacrylate, 2-ethyl hexyl methacrylate, isodecyl methacrylate, n-lauryl methacrylate, C12-C15 alkyl methacrylates, n-stearyl methacrylate, n-butoxyethyl methacrylate, butoxydiethylene glycol methacrylate, methoxytriethylene glycol methacrylate, methoxypolyethylene glycol methacrylate, cyclohexyl methacrylate, tetrahydrofurfuryl methacrylate, benzyl methacrylate, 2-phenoxyethyl methacrylate, isobornyl methacrylate, 2-hydroxyethyl methacrylate, 2-hydroxypropyl methacrylate, 2-hydroxyethyl acrylate, 2-hydroxybutyl acrylate, 2-hydroxybutyl methacrylate, dimethylaminoethyl methacrylate, diethylaminoethyl methacrylate, methacrylic acid, 2-methacryloyloxyethyl succinic acid, 2-methacryloyloxyethyl hexahydrophthalate, 2-methacryloyloxyethyl 2-hydroxypropyl phthalate, glycidyl methacrylate, 2-methacryloyloxyethyl acid phosphate, ethylene glycol dimethacrylate, diethylene glycol dimethacrylate, triethylene glycol dimethacrylate, 1,4-butanediol dimethacrylate, neopentyl glycol dimethacrylate, 1,6-hexanediol dimethacrylate, 1,9-nonanediol dimethacrylate, 1,10-decanediol dimethacrylate, glycerin dimethacrylate, 2-hydroxy-3-acryloyloxypropyl methacrylate, dimethylol tricyclodecane dimethacrylate, dimethacrylate of ethylene oxide modified bisphenol A, trifluoroethyl methacrylate, perfluorooctylethyl methacrylate, isoamyl acrylate, lauryl acrylate, isotetradecyl acrylate, stearyl acrylate, butoxyethyl acrylate, ethoxydiethylene glycol acrylate, methoxytriethylene glycol acrylate, 2-ethyl hexylene glycol acrylate, methoxypolyethylene glycol acrylate, methoxydipropylene glycol acrylate, phenoxyethyl acrylate, phenoxypolyethylene glycol acrylate, acrylate of ethylene oxide modified nonylphenol, tetrahydrofurfuryl acrylate, isobornyl acrylate, 2-hydroxypropyl acrylate, 2-hydroxy-3-phenoxypropyl acrylate, 2-acryloyloxyethyl succinate, 2-acryloyloxyethyl hexahydrophthalate, 2-acryloyloxyethyl phthalate, 2-acryloyloxyethyl-2-hydroxyethyl phthalate, neopentyl glycol-benzoate-acrylate, 2-acryloyloxyethyl phosphate, triethylene glycol diacrylate, polytetramethylene glycol diacrylate, neopentyl glycol diacrylate, 3-methyl-1,5-pentanediol diacrylate, 1,6-hexanediol diacrylate, 2-butyl-2-ethyl-1,3-propanediol diacrylate, 1,9-nonanediol diacrylate, 2-methyl-1,8-octanediol-diacrylate, dimethylol tricyclodecane diacrylate, diacrylate of ethylene oxide modified bisphenol A, diacrylate of propylene oxide modified bisphenol A, trimethylolpropane-benzoate-acrylate, dimethacrylate of bisphenol A diglycidyl ether, diacrylate of bisphenol A diglycidyl ether, reaction products of 2-hydroxy-3-phenoxy propyl acrylate and toluene diisocyanate, and ethylene oxide-modified isocyanurate diacrylate.

11. The method as claimed in claim 10, wherein the anisotropic conductive film is heated and pressed for less than 10 seconds to connect the first and second terminals.

12. The composition as claimed in claim 1, wherein the second component is included in an amount of about 1 to 2.4%, based on the total weight of the acrylic rubber, the first component, the second component, the organic peroxide, and the conductive particles.

13. The composition as claimed in claim 1, wherein the second component is included in an amount of about 1 to 1.8%, based on the total weight of the acrylic rubber, the first component, the second component, the organic peroxide, and the conductive particles.

* * * * *